United States Patent [19]

Keida

[11] Patent Number: 4,963,770
[45] Date of Patent: Oct. 16, 1990

[54] PROGRAMMABLE LOGIC DEVICE

[75] Inventor: Hisaya Keida, Chiba, Japan

[73] Assignee: Kawasaki Steel Corporation, Japan

[21] Appl. No.: 469,728

[22] Filed: Jan. 24, 1990

Related U.S. Application Data

[63] Continuation of Ser. No. 270,830, Nov. 14, 1988, abandoned.

[30] Foreign Application Priority Data

Nov. 20, 1987 [JP] Japan .............................. 62-293721
Jun. 30, 1988 [JP] Japan .............................. 63-163389

[51] Int. Cl.$^5$ ......................................... H07K 19/177
[52] U.S. Cl. .................................... 307/465; 307/243
[58] Field of Search ................. 307/465–469, 307/475, 243, 272.2; 364/716

[56] References Cited

U.S. PATENT DOCUMENTS

| | | | |
|---|---|---|---|
| 4,642,487 | 2/1987 | Carter | 307/468 X |
| 4,758,745 | 7/1988 | El Garnel et al. | 307/468 X |
| 4,758,746 | 7/1988 | Birkner et al. | 364/716 X |
| 4,763,020 | 8/1988 | Takata et al. | 307/465 |
| 4,786,904 | 11/1988 | Graham, III et al. | 307/465 X |

FOREIGN PATENT DOCUMENTS

| | | |
|---|---|---|
| 177261 | 4/1986 | European Pat. Off. . |
| 61-224520 | 10/1986 | Japan . |
| 2171547 | 8/1986 | United Kingdom . |

OTHER PUBLICATIONS

Elektonik, vol. 36, no. 19, 18th Sep., 1987, pp. 30–32, Munchen, DE; H. Biehel: "ASICs: Anwenderprogrammierbare CMOS–Gate–Arrays".
Proceedings of the IEEE 1987 Custom Integrated Circuits Conference, Portland, OR, 4–7 May 1987, pp. 515–521, IEEE, NY, US; H. -C. HSIEH et al.: "A Second Generation User–Programmable Gate Array".
Hsieh et al., "A 9000–Gate–User–Programmable Gate Array," IEEE 1988 Custom Integrated Circuits Conference, pp. 15.3.1–15.3.7. (May 16–19, 1988).
El Gamal et al., "An Architecture for Electrically Configurable Gate Arrays," IEEE 1988 Custom Integrated Circuits Conference pp. 15.4.1–15.4.4. (May 16–19, 1988).

Primary Examiner—David Hudspeth
Attorney, Agent, or Firm—Oliff & Berridge

[57] ABSTRACT

In a programmable logic device having a plurality of programmable logic elements (PLEs) where each PLE includes a combinational logic circuit and a plurality of flip-flop circuits, input selector switches for selecting one of a plurality of input signals to be input into a flip-flop circuit are provided by which an output from a combinational logic circuit of its own PLE and an output from another PLE are made selectable. The output from the combinational logic circuit is also output independently of an output from a flip-flop circuit, so that either one of the outputs can be utilized by use of external programmble wiring. Further by selecting respective input terminals of each flip-flop circuit, an output signal from an adjoining flip-flop circuit is inputtable into another flip-flop circuit, so that the flip-flop circuits can be serially connected to each other. Additionally, the last flip-flop circuit of one PLE can supply an output signal to a first flip-flop circuit of an adjoining PLE by the selection of an input terminal which connects the adjoining PLEs through connecting wiring for specialized use, so that adjoining PLEs can be connected to each other without passing through the programmable wirings.

10 Claims, 8 Drawing Sheets

PRIOR ART

FIG.7

PRIOR ART

PROGRAMMABLE LOGIC DEVICE

This is a continuation of application Ser. No. 07/270,800 filed Nov. 14, 1988, abandoned.

BACKGROUND OF THE INVENTION (A) Field of the Invention

The present invention relates to a programmable logic device (hereinafter referred to as "PLD") including a plurality of programmable logic elements (hereinafter referred to "PLE") having a plurality of flip-flop circuits.

(B) Prior Art

There has heretofore been known a PLD in which optional logic circuits are arranged by a user who programs the circuits. For example, there is the one disclosed in Japanese Patent Unexamined Publication Nos. 198919/1986 and 224520/1986.

Figure 5:
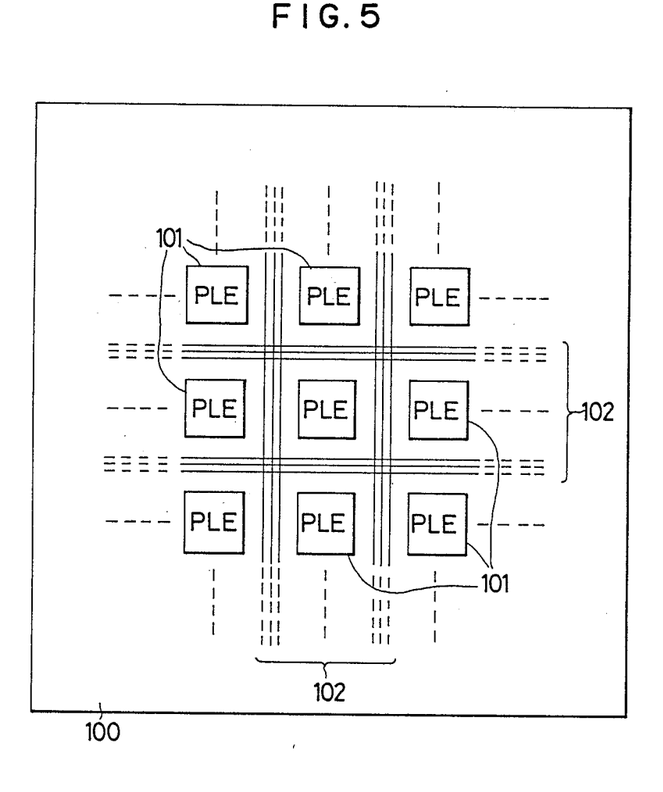
FIG. 5 is an arrangement diagram of a PLD.

FIG. 5 is a block diagram of a PLD. In this PLD, a plurality of PLEs 101 are provided on a chip 100, and further, input terminals and output terminals of PLEs 101 can be desirably connected to each other by programmable wiring means 102 in vertical and horizontal directions between the terminals.

The PLE 101 has a combinational logic circuit such as a programmable logic array (hereinafter referred to as "PLA") having a programmable AND plane or OR plane, and a table look-up type logic circuit, and may have one or a plurality of flip-flop circuits (hereinafter referred to as "F/F") as necessary.

Figure 6:
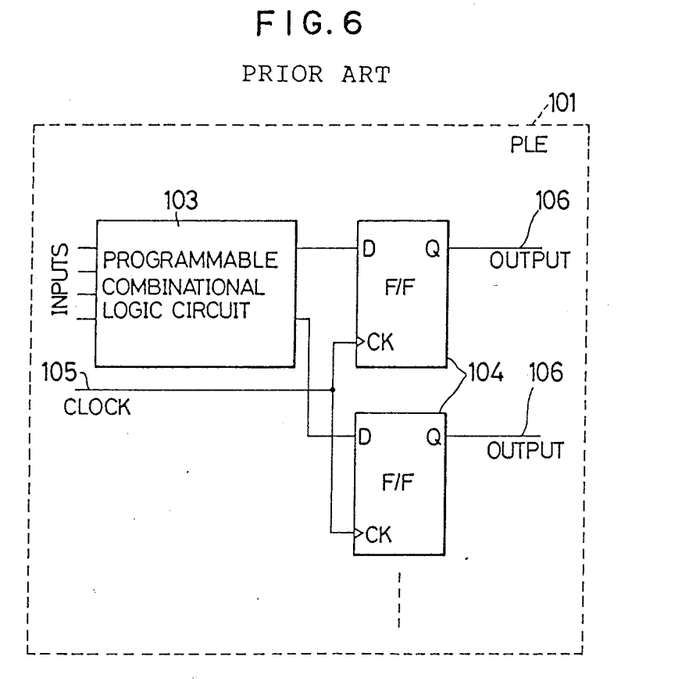
FIG. 6 and 7 are circuit diagrams showing conventional examples.
Figure 7:
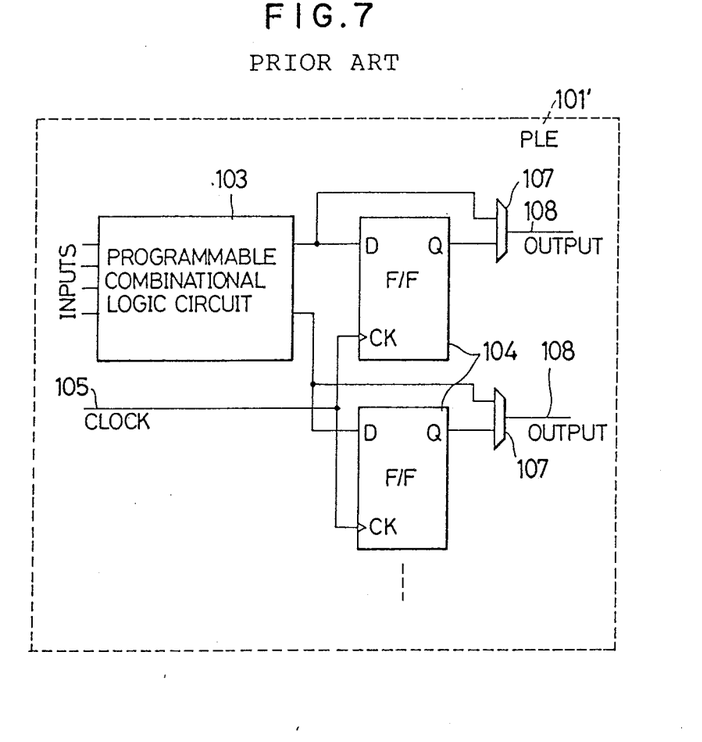

FIGS. 6 and 7 are circuit diagrams showing the conventional examples of the PLE 101. In a PLE 101 shown in FIG. 6, output signals from a programmable combinational logic circuit 103 are connected to a plurality of D input terminals of a plurality of F/Fs 104. The input signals of F/Fs 104 are subjected to a sampling by a clock signal input into a clock input terminal 105. Output terminals 106 of the D-F/Fs 104 provide output terminals of the PLE 101.

Another PLE 101' shown in FIG. 7 has substantially the same arrangement as that shown in FIG. 6. However, outputs from the programmable combinational logic circuit 103 and outputs from the D-F/F 104 are received by multiplexers 107 as their input signals and the multiplexers 107 selectively output either one of these input signals. Output terminals 108 of the multiplexers 107 are formed to provide output terminals of the PLE 101'.

However, PLDs having the above conventional construction suffer from the following problems:

(1) As shown in FIG. 6, the outputs of the PLE 101 are obtainable only from the F/Fs 104. However, it is also desirable to obtain outputs directly from the programmable combinational logic circuit 103. With the construction of FIG. 6, the only way to provide such an output is to have a PLE not having the F/F 104 for utilization. Accordingly, there occurs a case where the PLE 101 having the F/F 104 is not used or not usable.

(2) As shown in FIG. 7, multiplexer 107 can select either one of the aforesaid two outputs. Thus, the problem of the aforesaid Item (1) can be solved. However, the F/F 104 can be used only alternatively, namely to use or not to use. Accordingly, when the F/F 104s are not used, waste and inefficiency results. This waste becomes remarkable as the number of the F/Fs 104 in the PLE 101' is increased.

Figure 8:
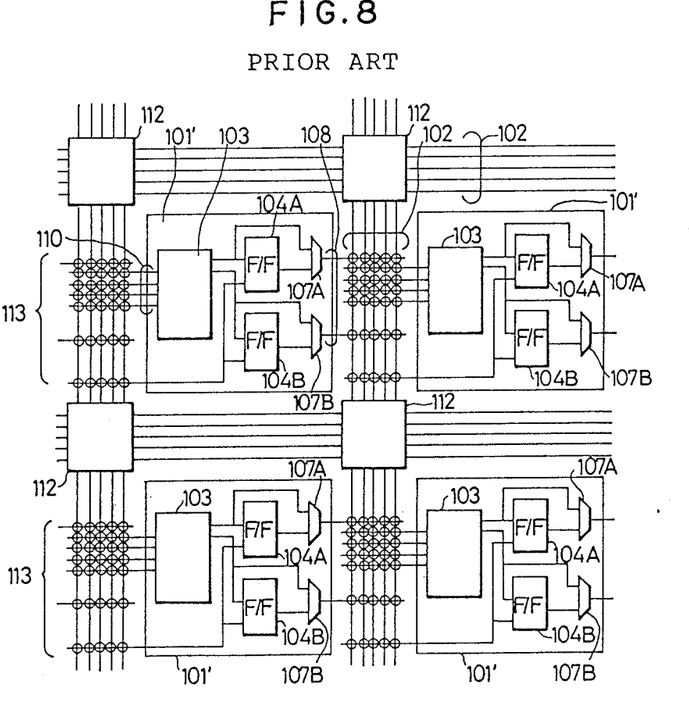
FIG. 8 is a circuit arrangement diagram of a conventional PLD.

FIG. 8 is a conventional circuit arrangement diagram of the PLD, in which the PLE 101' has a plurality of (two in the drawing) F/Fs 104A and 104B as shown in FIG. 7. This conventional PLD has a plurality of PLEs 101' and programmable wiring 102 disposed in every vertical and horizontal directions. Similarly to that shown in FIG. 7, the PLE 101' comprises:

the programmable combinational logic circuit 103;

F/Fs 104A and 104B which receive outputs from programmable combinational circuit 103 as their inputs; and multiplexers 107A and 107B which selectively output to the output terminals 108 either one of an output signal from respective F/Fs 104A and 104B, and an output signal from the programmable combinational logic circuit 103.

Furthermore, the programmable wirings 102 have;

switch arrays 112 capable of freely connecting respective wirings with each other at points where wirings in vertical and horizontal directions intersect each other; and input/output switch arrays 113 capable of freely connecting the input terminals 110 and the output terminals 108 of the PLEs 101' to the respective wirings.

Figure 3:
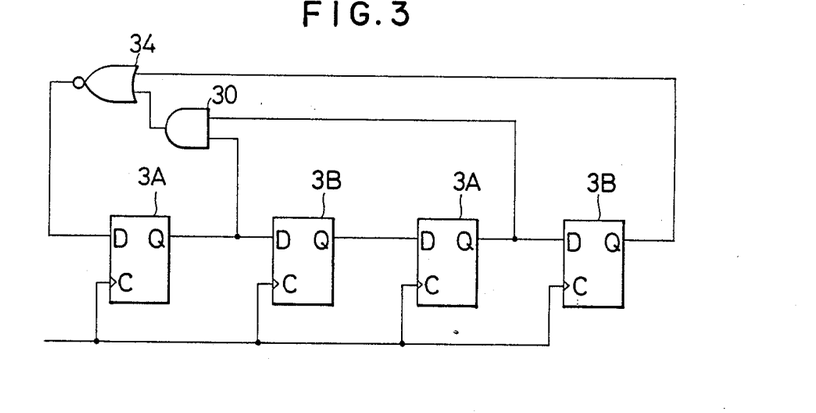
FIG. 3 is a circuit diagram of a counter circuit realized by use of the PLD.
Figure 9:
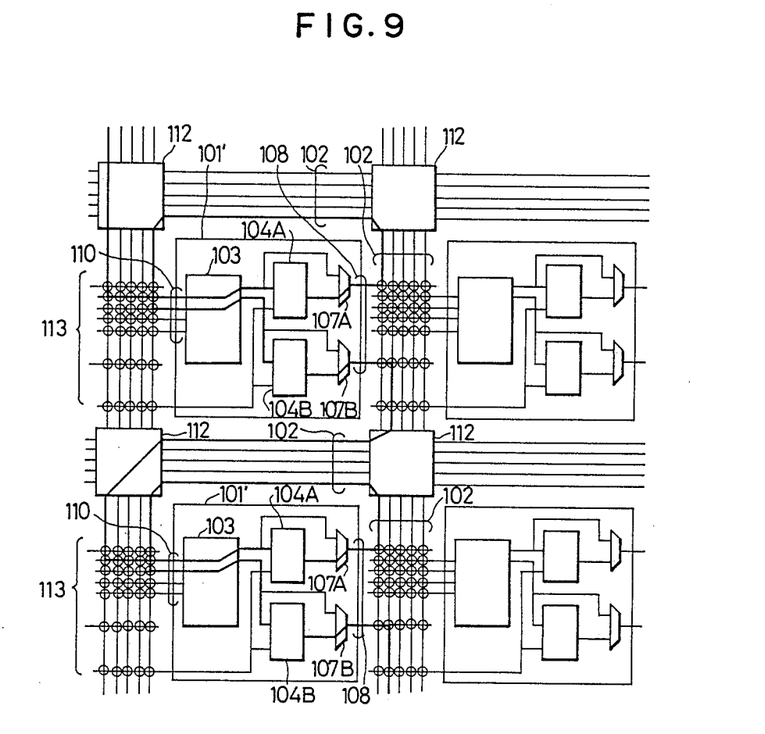
FIG. 9 is a connection diagram in which a conventional PLD is used.

FIG. 9 is a connection diagram when a four bit counter circuit is formed by the conventional PLD as shown in FIG. 8. Respective output signals from the F/Fs 104A and 104B of the conventional PLE 101' together with output signals from the programmable combinational logic circuit 103 are passed through the multiplexers 107A and 107B and connected to the output terminals 108 of the PLE 101'. Accordingly, an output signal from one of the F/Fs (104A) is usually input into another PLE 101' and; when it is desired to input the aforesaid output signal into the other one of the F/Fs (104B) of the same PLE 101', it is necessary to connect through the programmable wirings 102. For this reason, four F/Fs were conventionally connected together to form a four bit counter circuit as shown in FIG. 3, as indicated by solid lines in FIG. 9. The desired connection could be achieved by programming the respective switch arrays 112, the input/output arrays 113, the programmable combinational logic circuits 103 and the multiplexers 107A and 107B. Thus, the output terminals 108 of the PLE 101' were repeatedly connected to the input terminals 110 of the original or another PLE 101', that is, to the input terminals of the programmable combinational circuits 103 of the respective PLEs 101'.

However, in the conventional PLD, when an output signal of a F/F of a PLE is connected to a F/F of the same or another PLE to form a counter circuit or the like, the output signal of the F/F is needed to be connected via programmable wirings 102 and the programmable combinational logic circuit 103, which have a relatively long delay time. Accordingly, the operatable frequency is delayed in the conventional PLE employing this arrangement.

SUMMARY OF THE INVENTION

The present invention has been developed to obviate the above-described disadvantages and has as its first object the provision of a PLD capable of improving the use efficiencies of F/Fs and a combinational logic circuit which are included in a PLE.

It is a second object of the present invention to provide a PLD including a plurality of PLEs each having a plurality of F/Fs, wherein output and input signals of the respective F/Fs are connected to each other, to thereby raise the operatable frequency of a realized circuit to a high speed.

To achieve the first object of the present invention, the arrangement of the PLD according to the present invention comprises a plurality of PLEs which can be desirably connected to each other, wherein:

the PLE has a combinational logic circuit and a plurality of F/Fs;

the respective F/Fs are independently provided with an input terminal for receiving an output from the combinational logic circuit, an input terminal for receiving an output from another PLE and a switching section for switching the outputs to input the selected output into the F/F; and each PLE is further provided with first outputting a result from output terminals for outputs of the combinational logic circuit and second output terminals for outputs of the respective F/Fs of the PLE, the first and second output terminals of the PLE being independent of each other.

Accordingly to the present invention, by means of the section for switching inputs into the F/Fs, the output from the combinational logic circuit of a PLE and the output from another PLE can be selected. In addition, the output from the combinational logic circuit is output independently of the outputs from the F/Fs, and either one of the outputs from the combinational logic circuit and the outputs from the F/Fs are made utilizable by means of external programmable wirings or the like. According to the present invention, by the selected input and the independent outputs, each of the plurality of F/Fs in the PLE and the combinational logic circuit can be usable either independently of each other or interconnectively. Accordingly, with the use of the above F/Fs and the combinational logic circuit arrangement, high freedom and flexibility are obtainable, thus improving the use effeciencies of the PLD.

To achieve the second object, the arrangement of a PLD according to the present invention features that, in the PLD having a plurality of PLEs capable of forming an optional logic circuit by programming and programmable wirings capable of freely connecting input terminals and output terminals of these PLEs to each other, wherein:

the PLE has number N of at least two F/Fs;

each of the F/Fs has a means for selecting one of input signals to an input terminal of the F/F;

some of the input terminals of the selecting means of a F/F No. 1 of each PLE are directly connected to an output terminal for a non-inverted output signal and/or an inverted output signal of a F/F No. N in an adjoining PLE seperate of the programmable wiring; and Others of the input terminals of the selecting means of a F/F No. I selected from the remaining F/Fs No. 2 to No. N of the PLE are connected to an output terminal for a non-inverted output signal and/or an inverted output signal of a F/F No. I-1.

According to the present invention, the means for selecting one of the signals input into the respective F/Fs is provided, and, by the selection made by the selecting means, output signals from the adjoining F/Fs are input into each other, thus enabling the F/Fs to achieve the desired serial connection. The last F/F of one PLE inputs its output signal into the first F/F of the adjoining PLE through a connecting line for the specialized use by the selection of the selecting means of the first F/F of the adjoining PLE similarly to the above, so that the mutual adjoining relationship therebetween can be established. As described above, the input and output signals of the F/Fs are directly connected to each other through the selecting means, but, not through the programmable wirings and the input terminals of the PLE, which have the long delay times, respectively. With this arrangement, the connections between these F/Fs make it possible to raise the operatable frequency of the realized counter circuit and the like to a high speed.

BRIEF DESCRIPTION OF THE DRAWINGS

The exact nature of this invention, as well as other objects and advantages thereof, will be readily apparent from consideration of the following specification with reference to the accompanying drawings, in which like reference characters designate the same or similar parts throughout the figures thereof and wherein.

DESCRIPTION OF THE BEST MODE

Embodiments of the present invention will hereunder be described in detail with reference to the accompanying drawings.

Figure 1:
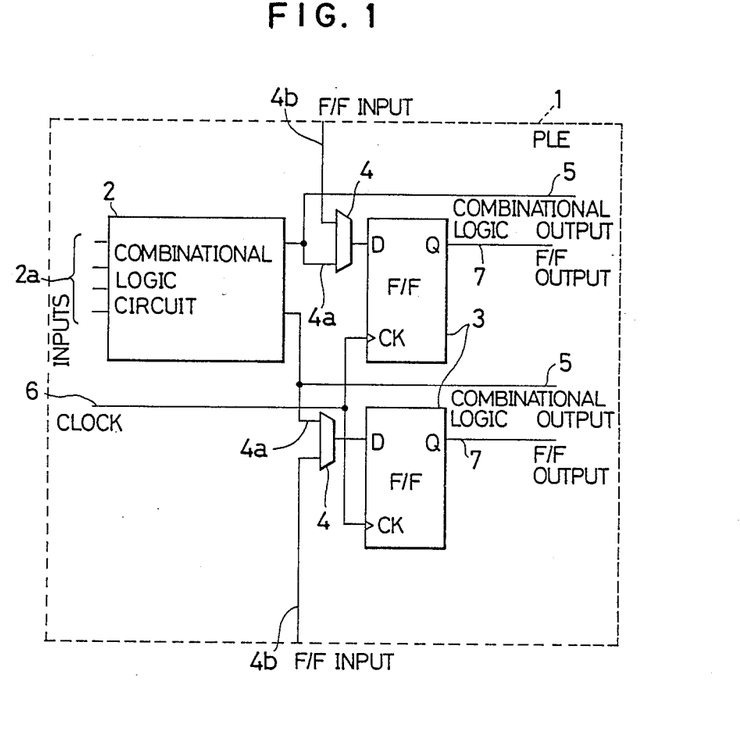
FIG. 1 is a circuit diagram of a PLE showing a first embodiment of the present invention.

FIG. 1 is the circuit diagram of the PLE showing the first embodiment of the present invention. The PLE 1 in this embodiment includes a programmable combinational logic circuit 2, a plurality of D-type F/Fs 3 (hereinafter representatively referred to as "F/Fs 3") and selectors 4 (hereinafter representatively referred to as "selectors 4"), and is assembled into a PLD as shown in FIG. 5.

The programmable combinational logic circuit 2 has a programmable logic array (hereinafter referred to as "PLA") including an AND plane or an OR plane, which have programmable product term lines, or a combinational logic circuit including a memory for storing a logic specification per combination of inputs of an input terminals 2a, to thereby obtain a logic output by a table look-up system. Outputs from the combinational logic circuit 2 are connected to independent combinational logical output terminals 5 and to input terminal 4a of the input terminals of respective selectors 4.

The selector 4 comprises two OR-connected n-channel MOS FETs, either one of the MOS FETs is on-controlled programmably, so that an input into one of the MOS FET is alternatively selected to be output. This selected output is connected to a D input terminal of the F/Fs 3.

Connected to input terminal 4a of the input terminals of the selector 4 is an output from the combinational logic circuit 2, the other input terminal 4b of the input terminals is connected to a F/F input terminal, into which an input from outside the PLE can be received.

The F/Fs 3 have common clock input terminals (which may be independent ones) 6 and F/F output terminals 7 which can output signals independently of each other. The F/Fs 3 are not limited to D types, and may be formed by other types.

Action of the above embodiment with the above-described arrangement will hereunder be described.

When inputs into the input terminals 4a on one side of the selectors 4, that is, outputs from the combinational logic circuit 2 are selected and applied to the D input terminals of the F/Fs 3, the outputs from the combinational logic circuit 2 are subjected to sampling by a clock and can be output from the output terminals 7 of the F/Fs 3.

When the input terminals 4b on the other side of the selector 4 are selected, in the F/Fs 3, outputs externally input from other logic elements are subjected to the sampling by the clock and can be output from the output terminals 7 of the F/Fs 3. Concurrently, the outputs from the combinational logic circuit 2 can also be output from combinational logic output terminals 5 provided independently of the output terminals 7 of the F/Fs 3. Namely, the combinational logic circuit outputs can be used for independent purposes. Of course, there are the plurality of F/Fs 3, some of the F/Fs 3 can be used for independent purposes and others can be connected to the output terminals of the combinational logic circuit 2 for combinational use. Furthermore, in the foregoing, it is possible to form a shift circuit and the like by connecting the output terminal or terminals of one of the F/Fs 3 of the PLE to the input terminal or terminals 4b of other F/Fs 3 in the same PLE.

As described above, when independently providing both the outputs of F/Fs 3 and the combinational logic circuit 2, the degree of freedom is increased to thereby obtain the desired flexibility, so that the remaining F/Fs in the PLE can be effectively utilized, thus improving the use efficiency of the PLD.

The second embodiment of the present invention will hereunder be described in detail.

Figure 2:
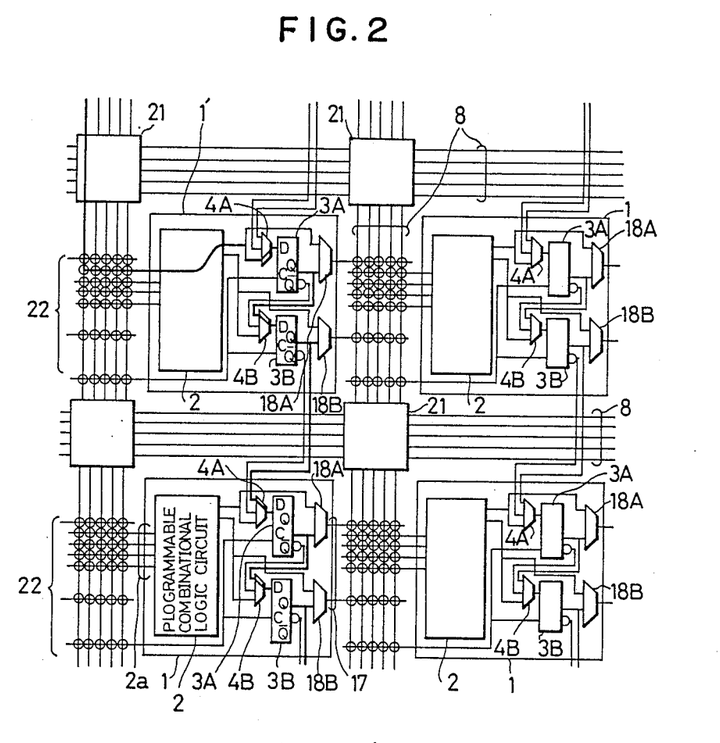
FIG. 2 is a circuit arrangement diagram of a PLD showing a second embodiment of the present invention.

FIG. 2 is the circuit arrangement diagram of the PLD showing the second embodiment of the present invention. This embodiment has a plurality of PLEs 1 and a plurality of programmable wirings 8 disposed in vertical and horizontal directions between the PLEs 1.

The PLE 1 has:

a programmable combinational logic circuit 2 for producing optional combinational logic outputs in response to input signals 2a by programming;

two D-type F/Fs 3A and 3B;

input selectors 4A and 4B connected to the D input terminals of the two F/Fs 3A and 3B, respectively, and being selecting means for selecting input signals; and output selectors 18A and 18B for selecting either output signals from the F/Fs 3A and 3B or output signals from the programmable combinational logic circuit 2 to output the same to a plurality of (two in the drawing) output terminals 17, respectively.

Here, separately connected to some of the input terminals of the input selector 4A of a first F/F 3A are a non-inverted output signal Q and an inverted output signal $\overline{Q}$ from a second (last) F/F 3B of an adjoining PLE 1', and connected to the other input terminals are output signals from its own programmable combinational logic circuit 2.

Furthermore, separately connected to some of the input terminals of the input selector 4B of the second F/F 3B are a non-inverted output signal Q and an inverted output signal $\overline{Q}$ from the first F/F 3A, and connected to the other input terminals are the other output signals from the programmable combinational logic circuit 2. The output signals Q and $\overline{Q}$ from the second F/F 3B are directly connected to input selectors of the first F/F of the further adjoining PLE, as necessary.

Switch arrays 21 are provided at intersections of the programmable wirings 8 and are disposed in vertical and horizontal directions, input and output lines of the input terminals 2a and the output terminals 17 of the respective PLEs 1, are made to intersect the wirings provided in vertical and horizontal directions, input-/output switch arrays 22 are provided at the intersections of the wirings 8 with the inputs/outputs of respective PLEs, and, the above-described members are programmed respectively, so that the input signals to and the output signals from the respective PLEs 1 can be wired mutually and freely.

Clock signals to the clock input terminals C of the F/Fs 3A and 3B are connected to the programmable wirings 8 through input/output switch arrays 22, whereby the clock signals are supplied from inside or outside of this PLD.

Action of the above second embodiment with the above-described arrangement will hereunder be described.

FIG. 3 is the circuit diagram of the four bit counter circuit to be realized by use of the PLD. This counter circuit includes four D-type F/Fs 3A (3B), in which D input terminals are serially connected, by an AND gate 30 and a NOR gate 34.

When this counter circuit is programmed on the PLD in this embodiment, the portion where the output terminals and the D input terminals of the F/Fs 3A (3B) are serially connected, or are directly connected to each other through the respective selectors 4A is indicated by solid lines in FIG. 2.

Figure 4:
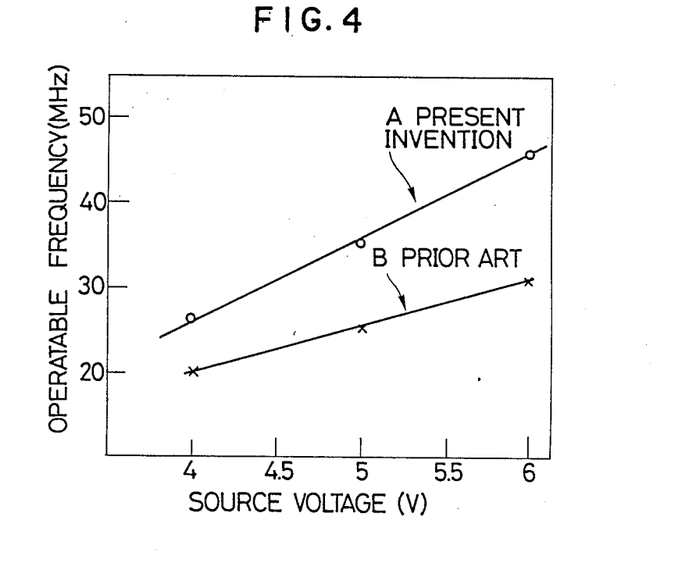
FIG. 4 is a graphic chart comparing the effects of the second embodiment and the conventional example.

FIG. 4 is the graphic chart comparing the effects of the second embodiment and the conventional example. An operatable frequency A designates the above counter circuit which is programmed on the PLD formed by CMOS according to the second embodiment, of the invention an operatable frequency B designates the above counter circuit which is programmed on the PLD formed by CMOS in the conventional example as shown in FIG. 8. The effects of these devices, are measured by changing their source voltages. In an embodiment of the instant invention, mutual connections between the input and output signals of the respective F/Fs can be made without passing through the programmable wirings and the programmable combinational logic circuit, which have relatively long delay times, so that the operatable frequency of the instant invention is about 1.5 times that in the conventional example, as shown in the measured results.

Incidentally, in the above second embodiment, the D-type F/Fs may be replaced with F/Fs of other types and the number of F/Fs is not limited to two. Furthermore, it is clear that the objects of the present invention can be fully achieved even if either one of the non-inverted output signal and the inverted output signal can be connected to the output signals of the F/Fs.

While, the present invention has been described with reference to particular embodiments, the invention is not limited to the specific examples given, and other embodiments, working modes and modifications can be made by those skilled in the art without departing from the spirit and scope of the invention.

What is claimed is:

1. A programmable logic device comprising a plurality of programmable logic elements which can be connected to each other, wherein:
   each said programmable logic element has a programmable combinational logic circuit and a respective plurality of flip-flop circuits;
   each flip-flop circuit of said respective plurality of flip-flop circuits is independently provided with a first input terminal for receiving an output from said combinational logic circuit, a second input terminal for receiving an output from another programmable logic element and a switching section for selecting one of the outputs received by said input terminals to input the selected output into the flip-flop circuit; and
   each said programmable logic element is further provided with first output terminals for outputting an output of said combinational logic circuit, and second output terminals for outputting outputs of said respective flip-flop circuits, said first and second output terminals being independent of each other.

2. The device as set forth in claim 1, wherein said flip-flop circuits are D-type flip-flop circuits.

3. The device as set forth in claim 1, wherein said combinational logic circuit is a programmable combinational logic array including an AND plane and an OR plane, which has programmable product term lines.

4. The device as set forth in claim 1, wherein said combinational logic circuit has a memory for storing a logic specification per combination of inputs received by said combinational logic circuit, to thereby obtain a logic output by a table look-up system.

5. The device as set forth in claim 1, wherein said switching section is a selector comprising a plurality of OR-connected n-channel MOS FETs, either one of the MOS FETs is on-controlled programmably, so that an input into said one of the MOS FETs is alternatively selected to be output.

6. The device as set forth in claim 1, wherein said combinational logic circuit and at least one flip-flop circuit are used independently of each other.

7. The device as set forth in claim 1, wherein an input into at least one of the respective plurality of flip-flop circuits is an output from another flip-flop circuit of the same programmable logic element.

8. A programmable logic device having a plurality of programmable logic elements capable of forming an optional logic circuit by programming programmable wirings capable of freely connecting input terminals and output terminals of said programmable logic elements to each other, wherein:
   each said programmable logic element has a number N of flip-flop circuits, said flip-flops being sequentially numbered 1 to N;
   each of the flip-flop circuits has an input terminal and means for selecting one of a plurality of input signals to its input terminal;
   each said selecting means has at least two input terminals, at least one of the input terminals of each selecting means of a flip-flop circuit No. 1 of each programmable logic element is directly connected to an output terminal for a non-inverted output signal and/or an inverted output signal of a flip-flop circuit No. N in an adjoining programmable logic element, said connection being separate from said programmable wirings; and
   at least one of the input terminals of each selecting means of a flip-flop circuit No. I selected from the remaining flip-flop circuits No. 2 to No. N of the programmable logic element is connected to an output terminal for a non-inverted output signal and/or an inverted output signal of a flip-flop circuit No. I-1 of its respective programmable logic element.

9. The device as set forth in claim 8, wherein each said programmable logic element comprises:
   a programmable logic circuit for producing an optional combinational logic output in response to input signals by programming;
   a plurality of D-type flip-flop circuits;
   said input signal selecting means being connected to respective D input terminals of said plurality of flip-flop circuits, for selecting input signals to the D input terminals; and
   output selectors for selecting output signals from one of said plurality of flip-flop circuits or an output signal from the programmable logic circuit to output the selected output signal.

10. The device as set forth in claim 8, wherein a non-inverted output signal and/or an inverted output of the last flip-flop circuit No. N of an adjoining programmable logic element are directly connected to the respective input signal selecting means of the first flip-flop circuit No. 1 of another adjoining programmable logic element.

* * * * *